United States Patent [19]
Iwama et al.
[11] 3,859,098
[45] Jan. 7, 1975

[54] PHOTORESIST COMPOSITION

[75] Inventors: Hideaki Iwama; Akio Iwaki; Hiroyoshi Yamaguchi, all of Tokyo, Japan

[73] Assignee: Konishiroku Photo Industry Co., Ltd., Tokyo, Japan

[22] Filed: July 13, 1972

[21] Appl. No.: 271,534

[30] Foreign Application Priority Data
July 15, 1971 Japan .............................. 46-52094

[52] U.S. Cl. ...................... 96/90 R, 96/33, 96/35.1, 96/36.2, 96/36.3, 96/36.4, 96/115 R, 204/159.18
[51] Int. Cl. .............................................. G03c 1/70
[58] Field of Search ........................ 96/115 R, 90 R; 204/159.18

[56] References Cited

UNITED STATES PATENTS

| | | | |
|---|---|---|---|
| 3,579,343 | 5/1971 | Kogure et al. | 96/115 R |
| 3,690,890 | 9/1972 | Yamaguchi et al. | 96/115 R |

*Primary Examiner*—Ronald H. Smith
*Attorney, Agent, or Firm*—Waters, Roditi, Schwartz & Nissen

[57] ABSTRACT

A photoresist composition comprises a carboxy group-containing polymer, in which part or all of the hydrogen atoms have been substituted by an alkali metal, and a photoactivator having a polyhalogenated methyl group capable of yielding a free radical by action of light. The photoresist composition can be developed merely with water or hot water.

15 Claims, No Drawings

PHOTORESIST COMPOSITION

This invention relates to a novel photoresist composition comprising a photoactivator having a polyhalogenated methyl group capable of yielding a free radical by action of light and an alkali metal-substituted polymer.

The photoresist composition according to the present invention is applied to a suitable support to obtain a light-sensitive material. When this light-sensitive material is subjected to image-wise exposure, the water-soluble alkali metal-substituted polymer is photo-cross-linked to become hard and water-insoluble, and when the thus exposed light-sensitive material is developed with mere water or hot water, the unexposed portion is dissolved and removed to form a resist image usable for offset printing, relief printing, photogravure name plate, printed circuits, screen printing, etc.

Heretofore, a photoresist composition containing a photoactivator and a polymer as main components has been provided by Japanese Patent Publication No. 4,605/71. This photoresist composition cross-links by exposure to light to form a faint visible image and hence can advantageously prevent multiple exposure. At the time of development, however, a photoresist using the said composition requires an organic solvent or aqueous alkali solution, and hence brings about various drawbacks at the development step. That is, in case an organic solvent is used, care must be taken with respect to fire, heat and ventilation, and there is the danger that the skin may become inflamed when contacted therewith over a long period of time or frequently. Moreover, the vapor of an organic solvent is harmful to the human body, as is well known. On the other hand, in case an aqueous alkali solution is used, not only is there the danger that the skin or the like will be affected as well, but also the developer should be prepared for each time so as not to cause uneven development due to variation in alkali concentration. Furthermore, the resulting resist image has a swelling property, and the swelled resist is not only degraded in resisting strength but also deteriorated in adhesion between the resist film and the support. Particularly when used for relief printing, the photoresist using the conventional photoresist composition is required to be subjected to film-hardening treatment and burning treatment over a long period of time. Even when used for offset printing, the said photoresist is lowered in printing resistance due to degradation in strength. Although the photoresist can form a visible image by imagewise exposure and hence is considerably prevented from the danger of double exposure, the distinctness of the visible image is still not satisfactory.

An object of the present invention is to provide a novel photoresist composition capable of giving a photoresist which can be developed by use of only water or hot water without using any organic solvent or aqueous alkali solution.

Another object of the invention is to provide a photoresist composition which has overcome all the above-mentioned drawbacks of the conventional photoresist composition.

A photoresist obtained by applying the photoresist composition of the present invention to a suitable support may be simply developed by use of only water or hot water, so that not only no particular attention is required to be paid to fire, heat and ventilation at the time of development but also no preparation of developer is necessary and uneven development due to variation in concentration of developer can be dismissed. Moreover, the photoresist using the present invention can be made far lower in swelling degree of resin film at the time of development than in the case of the conventional photoresist with the result that the photoresist can be markedly increased in strength and can be enhanced in adhesion between the resist film and the support. When used for relief printing, the photoresist using the present invention may be subjected, after development, to film-hardening and burning treatments for a far shorter period of time than in the case of the conventional photoresist. Even when used for offset printing, the photoresist according to the present invention can display superior printing resistance due to increase in strength.

The photoresist composition according to the present invention comprises a polymeric compound of the general formula shown below, in which part or all of the hydrogen atoms of carboxyl groups contained therein have been substituted by an alkali metal, and a photoactivator having a polyhalogenated methyl group capable of yielding a free radical by action of light.

General formula:

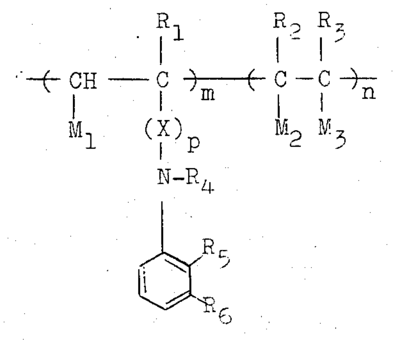

wherein $M_1$, $M_2$ and $M_3$ are individually a hydrogen atom, a carboxylic acid group or a carboxylic acid amide group, at least one of $M_1$, $M_2$ and $M_3$ being a carboxylic acid group; $R_1$ and $R_2$ are individually a hydrogen atom or a lower alkyl group; $R_3$ is a hydrogen atom, a lower alkyl group or a carboxymethyl group; X is a divalent organic group; p is 0 or 1; $R_4$ is a hydrogen atom, a lower alkyl group or a phenyl group; $R_5$ and $R_6$ are individually a hydrogen atom or a lower alkyl group, and, in case p=0, $R_4$ and $R_5$, in conjunction with each other, may form a nitrogen-containing heterocyclic ring, or $R_5$ and $R_6$, in conjunction with each other, may form a naphthalene ring together with the benzene ring; and *m* and *n* are individually an integer of 5 to 10,000.

Typical examples of the above-mentioned polymeric compound used in the present invention are shown below, but the examples are not limitative. In the examples, the alkali metal substitution ratio is a percentage representing the ratio of an alkali metal, which has been used to substitute the hydrogen atoms of carboxyl groups in the polymeric compound, to all the carboxyl groups in said polymeric compound prior to substitution with the alkali metal; $\overline{Mn}$ is a number average molecular weight of the polymeric compound; and m:n is a copolymerization ratio.

1. Polymeric compound (sodium substitution ratio 90 percent) of the formula,

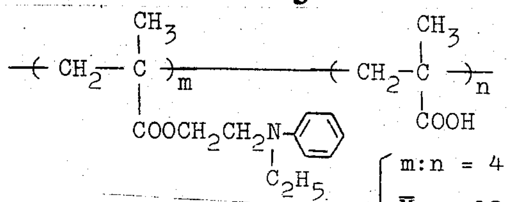

(m:n = 4:6, $\bar{M}n$ = 180,000)

2. Polymeric compound (potassium substitution ratio 90 percent) of the formula,

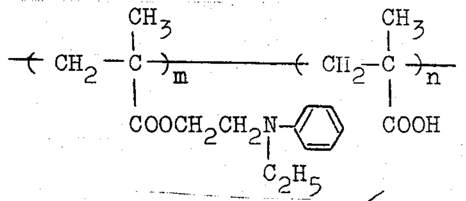

(m:n ÷ 4:6, $\bar{M}n$ ÷ 180,000)

3. Polymeric compound (potassium substitution ratio of 85 percent) of the formula,

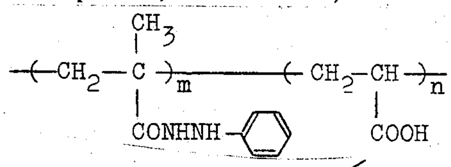

(m:n ÷ 4:6, $\bar{M}n$ ÷ 150,000)

4. Polymeric compound (sodium substitution ratio 60 percent) of the formula,

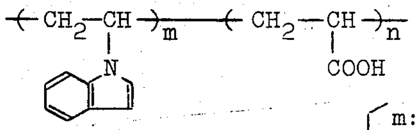

(m:n ÷ 3:7, $\bar{M}n$ ÷ 50,000)

5. Polymeric compound (potassium substitution ratio 60 percent) of the formula,

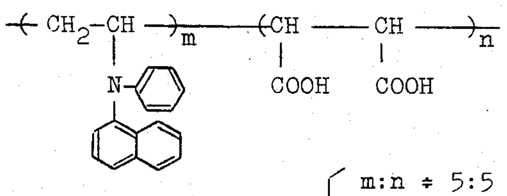

(m:n ÷ 5:5, $\bar{M}n$ ÷ 20,000)

6. Polymeric compound (potassium substitution ratio 50 percent) of the formula,

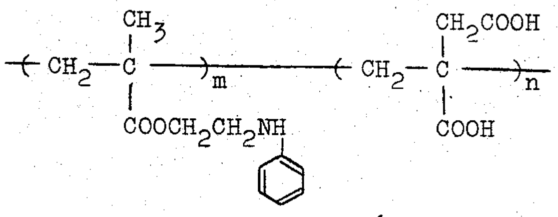

(m:n ÷ 6:4, $\bar{M}n$ ÷ 20,000)

7. Polymeric compound (potassium substitution ratio 75 percent) of the formula,

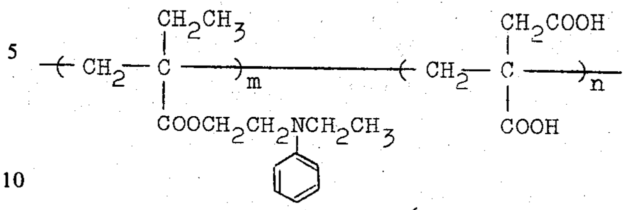

(m:n ÷ 6:4, $\bar{M}n$ ÷ 50,000)

8. Polymeric compound (lithium substitution ratio 75 percent) of the formula,

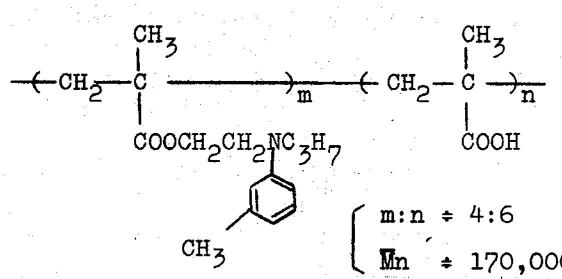

(m:n ÷ 4:6, $\bar{M}n$ ÷ 170,000)

9. Polymeric compound (lithium substitution ratio 80 percent) of the formula,

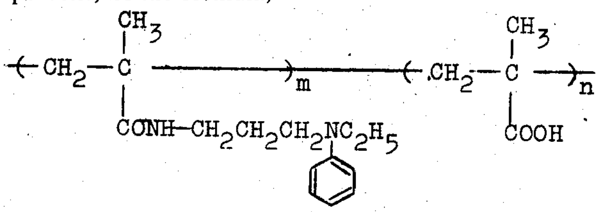

(m:n ÷ 4:6, $\bar{M}n$ ÷ 150,000)

10. Polymeric compound (sodium substitution ratio 75 percent) of the formula,

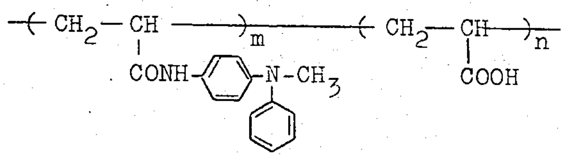

(m:n ÷ 5:5, $\bar{M}n$ ÷ 50,000)

11. Polymeric compound (lithium substitution ratio 65 percent) of the formula,

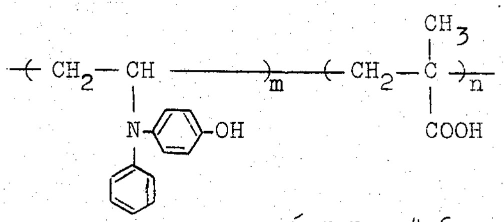

(m:n ÷ 4:6, $\bar{M}n$ ÷ 50,000)

12. Polymeric compound (lithium substitution ratio 80 percent) of the formula,

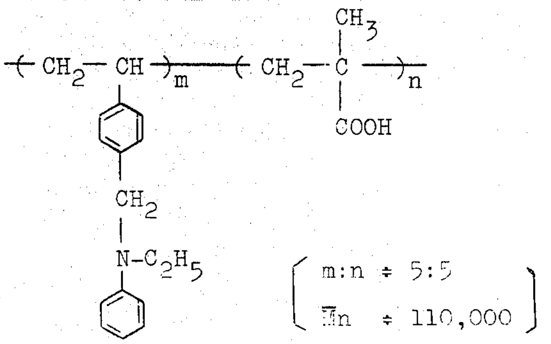

A general procedure for synthesis of the above-mentioned polymers is such that a copolymer, or a solution thereof, which is obtained by copolymerizing a vinyl monomer having an aromatic component with a vinyl monomer having a carboxylic acid (e.g., acrylic, methacrylic, maleic or itaconic acid or a derivative thereof), is reacted with an aqueous or alcoholic solution of an inorganic base containing an alkali metal (e.g., sodium hydroxide, potassium hydroxide, sodium carbonate or potassium carbonate) or with an alkali metal-substituted alcohol to obtain a desired polymer at a high purity and in a high yield. Usable alkali metals include lithium, sodium, potassium, etc.

Typical procedures for synthesizing the polymers used in the present invention are explained below with reference to Synthesis Examples.

SYNTHESIS EXAMPLE 1

Synthesis of the exemplified polymeric compound (1):

A mixture comprising 1,070 g. (6.5 moles) of N-ethyl-N-ethanolaniline, 1,300 g. (13.0 moles) of methyl methacrylate, 22.6 g. of titanium tetrabutoxide and 11 g. of 2,5-di-t-butyl hydroquinone as a polymerization inhibitor was heated to distill off an azeotropic mixture of methanol and methyl methacrylate at normal pressure and at 66° to 67°C. for about 8 hours. Subsequently, the mixture was subjected to distillation under reduced pressure to remove excess methyl methacrylate. After complete removal of the methyl methacrylate, the residue was subjected to distillation under reduced pressure to obtain N-ethyl-N-phenylaminoethyl methacrylate, b.p. 135°C./4 mmHg, yield 80 percent. 8.74 Grams of this N-ethyl-N-phenylaminoethyl methacrylate and 5.38 g. of methacrylic acid were dissolved in a mixed solvent comprising 20 ml. of methanol and 20 ml. of acetone. The resulting solution was incorporated with 23.4 mg. of $\alpha,\alpha'$-azobisisobutyronitrile and heated at 60°C. for 30 hours in a sealed tube which had been flushed with nitrogen. Thereafter, the reaction mixture was poured into water to deposit a white precipitate, which was then recovered by filtration and dried to obtain 13.5 g. of a white polymer (A). 10 Grams of this white polymer (A) was dissolved in 200 ml. of a 1:2 mixed solvent of acetone and methanol. Into the resulting solution was added dropwise with stirring 100 ml. of an aqueous solution containing 2.0 percent by weight of sodium carbonate. After completion of the addition, the stirring was further continued at room temperature for an additional 2 hours. Subsequently, acetone and methanol were removed under reduced pressure from the reaction mixture, whereby a transparent aqueous solution was obtained. This solution was poured into a large amount of acetone with stirring to deposit a white precipitate, which was then recovered by filtration and dried to obtain 9.4 g. of the exemplified polymeric compound (1).

SYNTHESIS EXAMPLE 2

Synthesis of the exemplified polymeric compound (2):

10 Grams of the white polymer (A) obtained in Synthesis Example (1) was dissolved in 120 ml. of a 1:2 mixed solvent of acetone and methanol. Into the resulting solution was added dropwise with stirring 50 ml. of an aqueous solution containing 5.0 percent by weight of potassium hydroxide. After completion of the addition, the stirring was further continued for an additional 2 hours. Subsequently, acetone and methanol were removed under reduced pressure from the reaction mixture, whereby a transparent aqueous solution was obtained. This solution was poured into a large amount of acetone with stirring to deposit a white precipitate, which was then recovered by filtration and dried to obtain 9.9 g. of the exemplified compound (2).

SYNTHESIS EXAMPLE 3

Synthesis of the exemplified polymeric compound (3):

6.6 Grams of 1-methacryl-2-phenyl-hydrazine (m.p. 130.5° – 131.5°C.) prepared by refluxing a mixture of methyl methacrylate and sodium phenylhydrazide in benzene solution for 1 hour, and 3.8 g. of acrylic acid were dissolved in 50 ml. of a 1:1 mixed solvent of methanol and acetone. The resulting solution was incorporated with 20.0 mg. of $\alpha,\alpha'$-azobisisobutyronitrile and then heated at 60°C. for 30 hours in a nitrogen gas atmosphere. After adding to the reaction mixture 120 ml. of a solution comprising methanol and acetone in a ratio of 1:2, a solution of 3.0 g. of potassium hydroxide in 50 ml. of methanol was added dropwise into the mixture with stirring, and then the stirring was further continued at room temperature for an additional 6 hours. Subsequently, the reaction mixture was concentrated under reduced pressure to one-third of the original volume. The resulting concentrate was poured into a large amount of acetone with stirring, whereby a white precipitate was formed. This precipitate was recovered by filtration and dried to obtain the exemplified compound (3).

According to the above-mentioned Synthesis Examples, other exemplified compounds can also be synthesized.

The photoactivator which is used in the present invention in combination with any of the above-mentioned compounds, i.e., the photoactivator having a polyhalogenated methyl group capable of yielding a free radical by action of light, is a compound of the general formula,

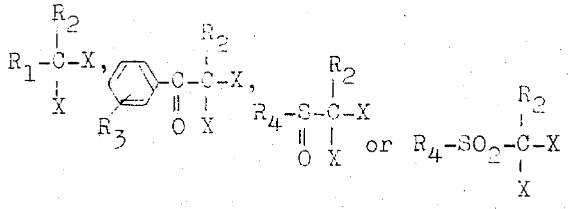

wherein $R_1$ is a hydrogen atom, an alkyl group, an aryl group, a halogen atom or a heterocyclic residue; $R_2$ is a hydrogen or halogen atom; $R_3$ is a hydrogen atom or represents 1 to 5 substituents on the benzene ring which are selected from the group consisting of nitro group, halogens, alkyl group, haloalkyl group, acetyl group, haloacetyl group, alkenyl group and alkoxy group, and are not always required to be identical with each other; $R_4$ is an alkyl group, an aryl group or a heterocyclic residue; and X is a halogen atom. Typical examples of the photoactivators having the above-mentioned general formulas include 2,2,2-tribromoethanol, p-nitro-α,α,α-tribromoacetophenone, ω,ω,ω-tribromoquinaldine, 2-ω,ω,ω-tribromomethyl-5-nitroquinoline, 2-ω,ω,ω-trichloromethyl-6-nitrobenzothiazole, α-ω,ω-dibromomethyl-4-chloropyridine, hexabromodimethyl sulfoxide, tribromomethylphenyl sulfone, 4-nitrotribromomethylphenyl sulfone and 2-tribromomethylsulfonyl benzothiazole.

The present invention is concerned with a photoresist composition comprising such specific polymeric compound and photoactivator as mentioned above which is used in such a manner that the composition is dissolved in an organic solvent, and the resulting solution is coated on a suitable support such as an aluminum plate, zinc plate, copper plate, plastic film base, paper or the like, and is then dried. Examples of the organic solvent used in this case include methanol, ethanol, dioxane, methyl cellosolve, ethyl cellosolve, butyl cellosolve, benzene, xylene, dimethyl formamide, dimethyl sulfoxide and tetrahydrofuran. These may be used either singly or in the form of a mixture. The coating solution of the present invention is composed of 100 parts by weight of the solvent, 1 to 50 parts, preferably 1 to 20 parts, by weight of the polymer, and 0.1 to 50 parts, preferably 1 to 10 parts, by weight of the photoactivator.

The polymer used in the present invention contains, on the side chain of the polymer, an amino group attached to the aromatic ring as a photocrosslinkable component and also contains an alkali metal salt of carboxylic acid as a water-soluble component.

In the polymer used in the present invention, the hydrogen in the para-position to the amino group in the aromatic ring on the side chain of the polymer is active. On the other hand, the photoactivator, which is a compound having a polyhalogenated methyl group, is such that when irradiated with light, it can have the polyhalogenated methyl group yield a free carbon radical. Accordingly, when the photoresist composition of the present invention, in which said polymer and photoactivator are present together, is exposed to light, the carbons in the para-position to the amino group of the aromatic ring on the side chain of the polymer are connected in 2 or 3 directions to the free carbon radical yielded from the photoactivator, with the result that a reticular structure having the carbon at the center is formed in the polymer. This reticular structure has the structure of a high molecular dye of the diphenylmethane or triphenylmethane type, and hence becomes a visible image. When the exposed surface of the light-sensitive material is treated with water or hot water, the unexposed portion is removed and the exposed portion gives a clear and tough relief image.

The polymer used in the present invention may have any molecular weight, but a molecular weight of 150,000 to 1,000,000 is preferable for relief printing and a molecular weight of 5,000 to 150,000 is preferable for offset printing. The substitution ratio of the alkali metal to the carboxylic acid in the polymer used in the present invention is desirably varied to a suitable extent depending on the molecular weight of the polymer, the ratio of *m* to *n*, the uses of the resulting photoresist composition, etc., but is ordinarily from 40 to 100 percent based on the carboxylic acid in the polymer. Further, the alkali metal salt of carboxylic acid in the polymer of the present invention may be replaced by a corresponding ammonium salt, and a light-sensitive material containing such ammonium salt can also be developed with water as in the case of a light-sensitive material containing a corresponding alkali metal salt.

The photoresist composition according to the present invention may be spectrally sensitized. That is, the composition of the present invention can be increased in sensitivity by addition of an acridine, cyanine, merocyanine, styryl, triphenylmethane or the like dye. Further, the composition of the present invention can be greatly enhanced in sensitivity by incorporation of an arylamine. Typical examples of the said arylamines include diphenylamine, dibenzylaniline, triphenylamine, N,N-diethylaniline, N,N-dipropylaniline, N-hydroxyethyl-N-ethylaniline, N-N-diphenylethylenediamine and o-aminodiphenylamine. Still further, the photoresist composition according to the present invention may be incorporated with a cellulose alkyl ether such as cellulose methyl ether or cellulose ethyl ether in order to make favorable the coatability of the light-sensitive liquid on a support.

A light-sensitive material obtained by forming on a suitable support a layer of the thus constructed photoresist composition of the present invention can be developed with mere water or hot water without requiring any aqueous alkali solution or organic solvent, and hence is quite useful in practice. Furthermore, said light-sensitive material is higher in sensitivity and is more improved in distinctness of visible image formed by exposure than a light-sensitive material using the conventional photoresist composition, and the resist image obtained therefrom is excellent in strength.

The following test example shows a comparison between the photoresist composition of the present invention and that disclosed in Japanese Patent Publication No. 4,605/71:

TEST EXAMPLE

As a polymer component there was used each of the exemplified polymer (2) and a polymer (control polymer; disclosed in Japanese Patent Publication No. 4,605/71) identical in structure with the exemplified polymer (2) except that it had not been substituted by potassium. 3.0 Parts by weight of the said polymer component, 1.0 part by weight of tribromomethylphenyl sulfone as a photoactivator, 0.06 part by weight of triphenylmethane type dye Victoria Pure Blue BOH (produced by Hodogaya Chemical Industry Co.) as a sensitizing dye, and 0.1 part by weight of cellulose ethyl ether were dissolved in a mixed solvent comprising 25 parts by volume of methyl cellosolve and 25 parts by volume of methanol. The resulting coating solution of each photoresist composition was coated by means of a whirler onto a printing zinc plate having a polished surface and was then dried to prepare a light-sensitive plate. Each of the thus prepared light-sensitive plates was exposed for 2 minutes through an original of Kodak Photographic Step Tablet No. 2 (produced by Kodak Co.) to a 200V, 3KW mercury lamp at a distance of 70 cm., and then developed under optimum conditions. The light-sensitive plate having a layer of the photoresist composition of the present invention was developed with hot water kept at 35° to 40°C., and the light-sensitive plate having a layer of photoresist composition containing the control polymer was developed with an aqueous alkali solution. The results obtained were as set forth in Table 1, in which the sensitivity was represented by a number of residual resist steps.

Table 1

| Photoresist composition | Developer | Sensitivity |
|---|---|---|
| Composition of the present invention | Hot water at 35–40°C. | 12–13 |
| Composition containing the control polymer | Aqueous alkali solution | 6–7 |

As is clear from Table 1, the light-sensitive plate having a layer of the photoresist composition according to the present invention can not only be developed with mere hot water to make the development treatment safe and simple but also is greatly increased in sensitivity as compared with the lightsensitive plate using the conventional photoresist composition. Further, the resulting resist is high in distinctness of the visible image formed thereon, excellent in resistance to chemicals including etching solution applied, and hence can be used as a photoresist for name plate, offset printing, relief printing, printed circuits, ruling material, etc.

The reason why the photoresist composition according to the present invention is excellent in sensitivity as compared with the conventional photoresist composition and can improve the distinctness of visible image is considered ascribable to the fact that the hydrogen of carboxylic acid in the polymer used is substituted by an alkali metal, so that the system of the photoresist composition becomes basic to enhance the photoactivity of the polyhalogenated methyl group in the composition.

A light-sensitive material obtained by forming on a suitable support a layer of the photoresist composition of the present invention is exposed to light, developed with water or hot water and then dipped in an aqueous solution of an organic acid, preferably a mixture of organic acids, whereby the light-sensitive material can be hardened and the film strength of the resulting resist image can be increased. Typical examples of the organic acids used for the above purpose include adipic acid, acrylic acid, acetoacetic acid, isobutyric acid, itaconic acid, ethylenediaminetetraacetic acid, caproic acid, formic acid, valeric acid, citric acid, glycolic acid, glutaric acid, crotonic acid, chlorofumaric acid, α-chloropropionic acid, β-chloropropionic acid, succinic acid, acetic acid, cyanoacetic acid, diethylacetic acid, dichloroacetic acid, oxalic acid, d-tartaric acid, meso-tartaric acid, thioglycolic acid, trichloroacetic acid, trimethylacetic acid, lactic acid, vinylacetic acid, fumaric acid, propionic acid, maleic acid, malonic acid, monochloroacetic acid, n-butyric acid, malic acid, aminobenzenesulfonic acid, benzoic acid, nucleus-substituted benzoic acid, quinolinic acid, cresol, phenylacetic acid, nucleus-substituted phenylacetic acid, chlorophenol, cinnamic acid, alicylic acid, cyclohexanecarboxylic acid, cyclohexanedicarboxylic acid, dichlorophenol, 2,4-dinitrophenol, diphenylacetic acid, sulfanilic acid, terephthalic acid, trichlorophenol, picric acid, pyridine-2,4-dicarboxylic acid, pyridine-2,6-dicarboxylic acid, phthalic acid, benzenesulfonic acid and gallic acid. These organic acids are used in the form of an aqueous solution having a concentration of 0.1 percent to 50 percent, in general though the concentration varies depending on the kind of organic acids used and the intended use of the resulting photoresist. The aqueous solution is an excellent film-hardening solution also in the case of a resist image formed by use of a light-sensitive material having a layer of the photoresist composition disclosed in Japanese Patent Publication No. 4,605/71, and the resist image can successfully be hardened by mere dipping in said solution. The film hardening treatment is desirably effected immediately after development of the light-sensitive material.

The present invention is illustrated in further detail below with reference to examples, but it is needless to say that the modes of practice of the invention are not limited to the examples.

EXAMPLE 1

A mixture of 1.0 part by weight of tribromomethylphenyl sulfone, 3.0 parts by weight of the exemplified polymer (9) 0.06 part by weight of a triphenylmethane type dye (Victoria Pure Blue BOH, produced by Hodogaya Chemical Co.) and 0.1 part by weight of cellulose ethyl ether was dissolved in a mixed solvent comprising 25 parts by volume of ethyl cellosolve and 25 parts by volume of methanol. The resulting solution was coated by means of a whirler onto a printing zinc plate having a polished surface and then dried to prepare a light-sensitive plate. This light-sensitive plate was superposed with a negative transparent original film, set to a vacuum printer and exposed for about 3 minutes to a 100V, 30A carbon arc lamp at a distance of about 40 cm., whereby a clear blue positive image was formed. The thus exposed light-sensitive plate was developed for 1 minute with running hot water at 35° to 40°C., whereby the unexposed portion was removed and the exposed portion was left as a blue resist image. Subsequently, the plate was etched with an ordinary Dow etching solution, washed with water and then subjected to a relief printing machine to obtain many printed copies having a printed image with a clear contour.

When the light-sensitive plate was dipped, prior to etching with the Dow etching solution, in a mixed aqueous solution containing 5 percent of citric acid and 5 percent of tartaric acid, the film of the resist image was increased in strength and more favorable results could be obtained.

EXAMPLE 2

A mixture of 1.0 part by weight of paranitrotribromomethylphenyl sulfone and 5.0 parts by weight of the exemplified polymer (10) was dissolved in a mixed solvent comprising 25 parts by volume of dioxane and 25 parts by volume of methanol. The resulting solution was coated by means of a whirler onto a printing zinc plate having a polished surface and then dried to prepare a light-sensitive plate. This light-sensitive plate was superposed with a negative transparent original film, set to a vacuum printer and exposed for 1 minute and 30 seconds to a 200V, 3KW mercury lamp at a distance of about 70 cm., whereby a clear blue positive image was formed. The thus exposed light-sensitive plate was developed for 30 seconds to 1 minute with running hot water at 35° to 40°C., whereby the unexposed portion was removed and the exposed portion was left as a blue resist image. Subsequently, the plate was etched with an ordinary Dow etching solution, washed with water and then subjected to a relief printing machine to obtain printed copies having a printed image with a clear contour.

EXAMPLE 3

A mixture of 3.0 parts by weight of hexabromodimethyl sulfone, 10.0 parts by weight of the exemplified polymer (7), 0.06 part by weight of a triphenylmethane type dye (Victoria Blue Base F4R, produced by BASF Co.) and 0.1 part by weight of cellulose ethyl ether was dissolved in a mixed solvent comprising 20 parts by volume of dioxane and 20 parts by volume of methanol. The resulting solution was coated by means of a whirler onto a mechanically grained aluminum foil and then dried to prepare a light-sensitive foil. This light-sensitive foil was superposed with a negative transparent original film, set to a vacuum printer and exposed to a chemical lamp for about 5 minutes, whereby a clear blue positive image was formed. The thus exposed foil was developed for 1 minute with running hot water at 30° to 35°C., whereby the unexposed portion was removed and the clear blue positive image was left. Subsequently, the foil was thoroughly washed with water, rendered water-retainable by means of damping water and then subjected to an offset printing machine to obtain many printed copies having a printed image with a clear contour.

EXAMPLE 4

A mixture of 1.0 part by weight of α-tribromomethylsulfonyl benzothiazole, 5.0 parts by weight of the exemplified polymer (11) and 0.1 part by weight of cellulose ethyl ether was dissolved in a mixed solvent comprising 30 parts by volume of benzene and 20 parts by volume of methanol. The resulting solution was coated onto an aluminum plate having a mechanically grained surface and then dried to obtain a light-sensitive plate. This light-sensitive plate was superposed with a negative, set to a vacuum printer and exposed for 2 to 3 minutes to a 500W tungsten lamp, whereby a blue positive image was formed. The thus exposed plate was developed for 1 minute with running city water at about 16°C. to obtain a deep blue positive relief image on the aluminum plate. This relief image was useful as a name plate or the like.

EXAMPLE 5

A mixture of 2.0 parts by weight of α-tribromomethylsulfonyl pyridine, 3.5 parts by weight of the exemplified polymer (1) and 0.06 part by weight of a triphenylmethane type dye (Victoria Blue Base F4R, produced by BASF Co.) was dissolved in a mixed solvent comprising 30 parts by volume of ethyl cellosolve and 20 parts by volume of methanol. The resulting solution was coated onto an ordinary printing base plate (a plate prepared by laminating a copper foil onto a asupport such as bakelite plate, phenol paper, epoxy paper or the like) and then dried to prepare a light-sensitive plate. This light-sensitive paper was superposed with a negative transparent original film, set to a vacuum printer and exposed for 5 minutes to a chemical lamp, whereby a clear blue positive image was formed. The thus exposed plate was developed for 30 seconds with city water at about 16°C., dried with hot air and then etched with a 40 wt percent aqueous ferric chloride solution. After the etching, the plate was dipped in a 5 percent alkali solution to remove the residual resist, washed with water and then dried to obtain a printed circuit board having an excellent finish.

What we claim is:

1. A photoresist composition consisting essentially of a solution of (A) a polymeric compound of the formula

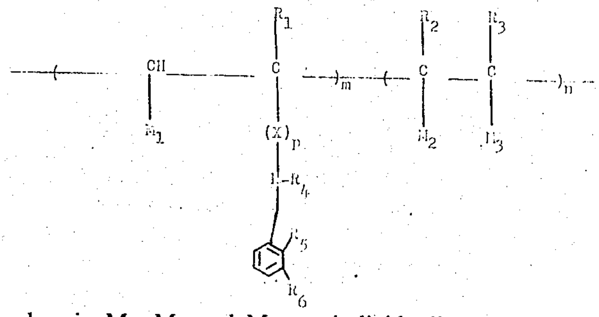

wherein $M_1$, $M_2$ and $M_3$ are individually a hydrogen atom, a carboxylic acid or a carboxylic acid amide, at least one of $M_1$, $M_2$ and $M_3$ being a carboxylic acid; $R_1$ and $R_2$ are individually a hydrogen atom or a lower alkyl group; $R_3$ is a hydrogen atom, a lower alkyl group or a carboxymethyl group; X is a divalent group; p is 0 or 1; $R_4$ is a hydrogen atom, a lower alkyl group or a phenyl group, $R_5$ and $R_6$ are individually a hydrogen atom or a lower alkyl group and, in case p=0, $R_4$ and $R_5$, in conjunction with each other, may form a nitrogen-containing heterocyclic ring, or $R_5$ and $R_6$, in conjunction with each other, may form a naphthalene ring together with the benzene ring; and m and n are individually an integer of 5 to 10,000, in which part or all of the hydrogen atoms of the carboxyl groups contained therein have been substituted by an alkali metal, and (B) a photoactivator having a polyhalogenated methyl group capable of yielding a free radical by action of light in a solvent selected from the group consisting of methanol, ethanol, dioxane, methyl cellusolve, ethyl cellusolve, butyl cellusolve benzene, xylene, dimethyl formamide, dimethyl sulfoxide and tetrahydrofuran.

2. A photoresist composition as claimed in claim 1, wherein said photoactivator is a compound of the general formula

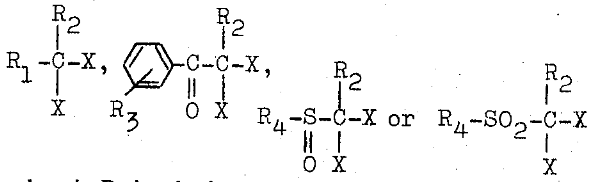

wherein $R_1$ is a hydrogen atom, an alkyl group, an aryl group, a halogen atom or a heterocyclic residue; $R_2$ is a hydrogen or halogen atom; $R_3$ is a hydrogen atom or represents 1 to 5 substituents on the benzene ring which are selected from the group consisting of nitro group, halogens, alkyl group, haloalkyl group, acetyl group, haloacetyl group, alkenyl group and alkoxy group, and are not always required to be identical with each other; $R_4$ is an alkyl group, an aryl group or a heterocyclic residue; and X is a halogen atom.

3. A photoresist composition as claimed in claim 1, wherein said polymeric compound is represented by the formula

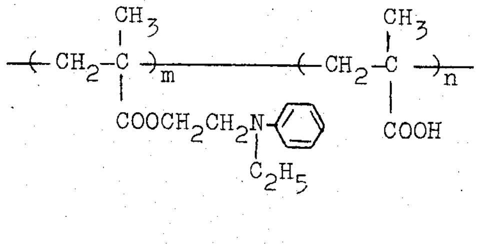

(wherein *m:n* is 4:6 and $\overline{Mn}$ is 180,000) and has the sodium substitution ratio of 90 percent.

4. A photoresist composition as claimed in claim 1, wherein said polymeric compound is represented by the formula

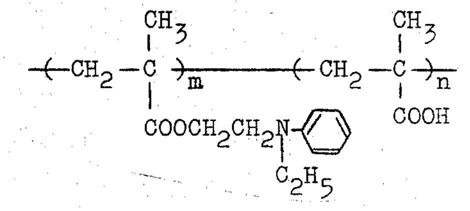

(wherein *m:n* is 4:6 and $\overline{Mn}$ is 180,000) and has the potassium substitution ratio of 90 percent.

5. A photoresist composition as claimed in claim 1, wherein said polymeric compound is represented by the formula

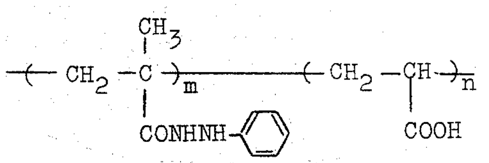

(wherein *m:n* is 4:6 and $\overline{Mn}$ is 150,000) and has the potassium substitution ratio of 85 percent.

6. A photoresist composition as claimed in claim 1, wherein said polymeric compound is represented by the formula

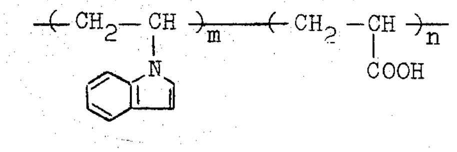

(wherein m:n is 3:7 and $\overline{Mn}$ is 50,000) and has the sodium substitution ratio of 60 percent.

7. A photoresist composition as claimed in claim 1, wherein said polymeric compound is represented by the formula

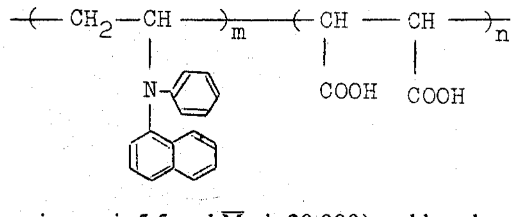

(wherein *m:n* is 5:5 and $\overline{Mn}$ is 20,000) and has the potassium substitution ratio of 60 percent.

8. A photoresist composition as claimed in claim 1, wherein said polymeric compound is represented by the formula

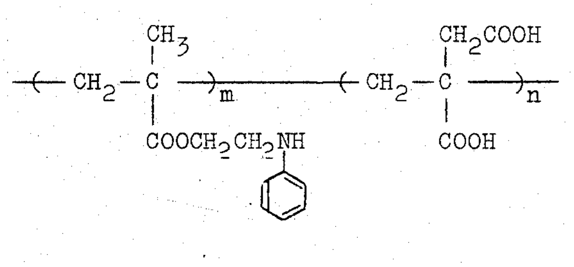

(wherein m:n is 6:4 and $\overline{Mn}$ is 20,000) and has the potassium substitution ratio of 50 percent.

9. A photoresist composition as claimed in claim 1, wherein said polymeric compound is represented by the formula

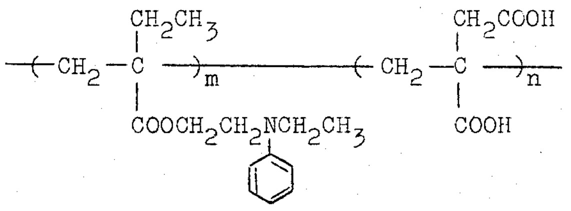

(wherein m:n is 6:4 and $\overline{Mn}$ is 50,000) and has the potassium substitution ratio of 75 percent.

10. A photoresist composition as claimed in claim 1, wherein said polymeric compound is represented by the formula

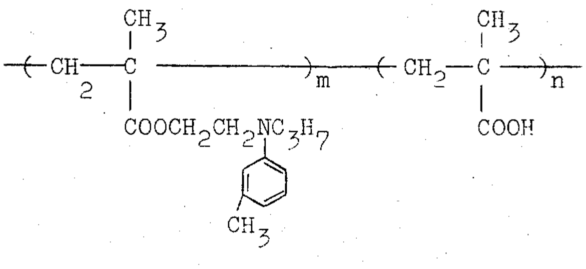

(wherein *m:n* is 4:6 and $\overline{Mn}$ is 170,000) and has the lithium substitution ratio of 75 percent.

11. A photoresist composition as claimed in claim 1, wherein said polymeric compound is represented by the formula

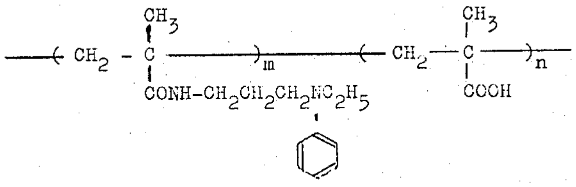

(wherein *m:n* is 4:6 and $\overline{Mn}$ is 150,000) and has the lithium substitution ratio of 80 percent.

12. A photoresist composition as claimed in claim 1, wherein said polymeric compound is represented by the formula

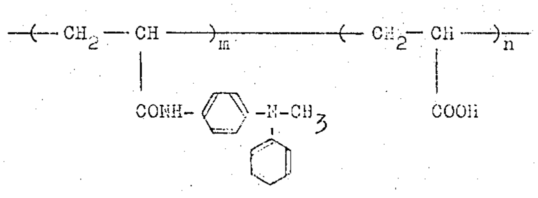

(wherein m:n is 5:5 and $\overline{M}n$ is 50,000) and has the sodium substitution ratio of 75 percent.

13. A photoresist composition as claimed in claim 1, wherein said polymeric compound is represented by the formula

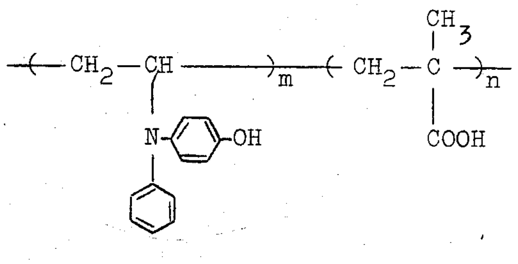

(wherein *m:n* is 4:6 and $\overline{M}n$ is 50,000) and has the lithium substitution ratio of 65 percent.

14. A photoresist composition as claimed in claim 1, wherein said polymeric compound is represented by the formula

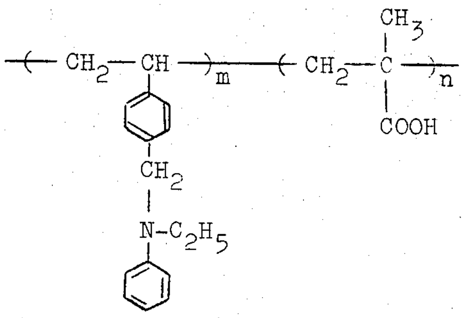

(wherein *m:n* is 5:5 and $\overline{M}n$ is 110,000) and has the lithium substitution ratio of 80 percent.

15. A photoresist composition according to claim 1 where X is a group selected from the group consisting of $-COOCH_2CH_2-$, $-CONH-$, $-COOCH_2CH_2OCH_2CH_2-$, $-CONHCH_2CH_2CH_2-$

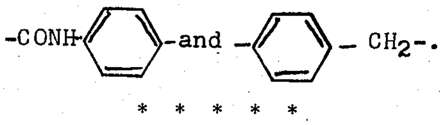

* * * * *